United States Patent
Murata et al.

[11] Patent Number: 5,942,205
[45] Date of Patent: Aug. 24, 1999

[54] TITANATE WHISKERS AND PROCESS FOR THEIR PREPARATION

[75] Inventors: Hiroki Murata, Naruto; Masayoshi Suzue, Tokushima; Akiyoshi Kawaguchi, Tokushima; Fauzi Faustinus, Tokushima; Toshihiro Kamewa, Naruto; Tomohide Koizumi, Tokushima, all of Japan

[73] Assignees: Otsuka Kagaku Kabushiki Kaisha, Osaka; Tomita Pharmaceutical Co., Ltd., Naruto, both of Japan

[21] Appl. No.: 08/776,784

[22] PCT Filed: Jun. 10, 1996

[86] PCT No.: PCT/JP96/01571

§ 371 Date: Feb. 10, 1997

§ 102(e) Date: Feb. 10, 1997

[87] PCT Pub. No.: WO97/00340

PCT Pub. Date: Jan. 3, 1997

[30] Foreign Application Priority Data

| Jun. 14, 1995 | [JP] | Japan | 7-147343 |
| Aug. 22, 1995 | [JP] | Japan | 7-213722 |
| Aug. 25, 1995 | [JP] | Japan | 7-217098 |
| Dec. 1, 1995 | [JP] | Japan | 7-337929 |

[51] Int. Cl.$^6$ ............ C01G 23/04; C08K 3/22
[52] U.S. Cl. ............ 423/598; 423/635; 524/435; 524/437; 428/615
[58] Field of Search ............ 524/497, 436, 524/437, 435; 423/598, 635; 428/615

[56] References Cited

U.S. PATENT DOCUMENTS

| 3,484,260 | 12/1969 | Emslie et al. | 524/497 |
| 4,789,605 | 12/1988 | Kubo et al. | 428/614 |
| 4,927,793 | 5/1990 | Hori et al. | 423/598 |
| 5,366,816 | 11/1994 | Harada et al. | 423/598 |
| 5,772,898 | 6/1998 | Lewis | 210/762 |

FOREIGN PATENT DOCUMENTS

| 0 323 012 A2 | 7/1989 | European Pat. Off. |
| 61-191599 | 8/1986 | Japan |
| 62-240724 | 10/1987 | Japan |
| 63-210026 | 8/1988 | Japan |

OTHER PUBLICATIONS

Patent Abstract of Japan, vol. 014, No. 261, Jun. 6, 1990 (Abstract of JP Laid–Open 02–074526 A, Mar. 14, 1990).
Patent Abstract of Japan, vol. 014, No. 261, Jun. 6, 1990 (Abstract of JP Laid–Open 02–074527 A, Mar. 14, 1990).
Patent Abstract of Japan, vol. 096, No. 004, Apr. 30, 1996 (Abstract of JP Laid–Open 07–330498 A, Dec. 19, 1995).

*Primary Examiner*—Tae Yoon
*Attorney, Agent, or Firm*—Kubovcik & Kubovcik

[57] ABSTRACT

This invention aims to provide titanate whiskers which are excellent in heat resistance, chemical resistance and reinforcing effect and are low in coefficient of thermal conductivity.

The titanate whiskers of the invention are those represented by the formula

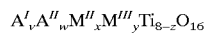

$$A'_v A''_w M''_x M'''_y Ti_{8-z} O_{16}$$

wherein $A'$ is at least one member selected from alkali metals, $A''$ is Ba, $M''$ is at least one member selected from the group consisting of Mg, Co, Ni, Zn, Cu and Mn, $M'''$ is at least one member selected from the group consisting of Al, Sc, Cr, Fe and Ga, and v, w, x, y and z are real numbers which fulfill $0.5 \leq 2x+y \leq 2.5$, $2x+y=v+2w$, and $z=x+y$.

1 Claim, 2 Drawing Sheets

TITANATE WHISKERS AND PROCESS FOR THEIR PREPARATION

FIELD OF THE INVENTION

The present invention relates to titanate whiskers, a process for preparing the titanate whiskers, and a resin composition and a composite material containing the titanate whiskers.

BACKGROUND ART

In recent years, various new materials have been researched and developed. Whiskers are known as one of them. The term whisker refers to a single-crystal filament having a cross-sectional area of up to $7.9 \times 10^{-5}$ square inches and a length of at least 10 times the average diameter. Since such whiskers are substantially free of transition in a crystal and are virtually flawless, and have tens to hundreds times the mechanical strength of polycrystals having the same make-up, the whiskers are very useful as reinforcing materials having properties such as high strength, outstanding rigidity and good abrasion resistance. So far potassium titanate whiskers, aluminum borate whiskers and the like have been put to practical use.

On the other hand, the existence of (priderite) titanate compounds is already known. For example, Japanese Examined Patent Publication No. 41,176/1987 discloses the preparation of powdery crystals of potassium aluminum titanate having the formula $K_{2.0}Al_{2.0}Ti_6O_{16}$—$K_{2.4}Al_{2.4}Ti_{5.6}O_{16}$ by a process comprising grinding and mixing powders of potassium carbonate, aluminum oxide and titanium oxide, calcining the mixture at 1,200° C. for 3 hours, grinding and mixing the calcined product and firing the powder at 1,200° C. for about 20 hours. Japanese Examined Patent Publication No. 12,236/1983 discloses the preparation of prismatic single crystals of potassium lithium magnesium titanate 0.5 mm in maximum diameter and 10 mm long and having the formula $$(K, Li)_{2-y}Mg_{1-y/2}Ti_{7+y/2}O_{16}$$

wherein Y is a number which fulfills $0 \leq Y \leq 1$ by a process comprising firing lithium carbonate, magnesium carbonate and titanium oxide and a powder mixture of potassium molybdate and molybdenum oxide as a flux at 1,300° C. for about 4 hours and gradually cooling the mixture to about 900° C. Further, H. Ohsato, J. Ceram. Soc. Jpn. 100 [2] 148–151 (1992) contains a schematic diagram showing the condition of potassium aluminum titanate at ambient pressure, and discloses the relationship between a ratio of components constituting the potassium aluminum titanate and a lattice constant given by X-ray diffraction.

However, priderite titanate whiskers and whiskers having pores inside are unknown.

Generally, whiskers heretofore known as having high strength are about 0.01 to about 1.0 $\mu$m in diameter and about 5 to about 30 $\mu$m in length. Such size is closely correlated with the reduction in internal defects of whiskers and with the strength of whiskers. That is to say, the growth of crystals beyond said dimensional range tends to result in polycrystals and decreases the mechanical strength. Reversely the whiskers which fall short of said dimensional range produce insufficient effects as reinforcing materials. However, it is very difficult to control such microscopic shape.

Particularly in the preparation of potassium aluminum titanate, an aluminum oxide conventionally used as an aluminum source component is difficult to microscopically mix with the other components because of its high hardness. Further an aluminum oxide is a stable substance even at a high temperature and thus necessitates a prolonged reaction at a high temperature for the growth of crystals. Crystals grown by a prolonged reaction at a high temperature are unavoidably bulky. For this reason, it has been difficult to form whiskers having a microscopic shape.

A process using a powder mixture of potassium molybdate and molybdenum oxide as a fusing agent for the foregoing powdery raw materials was proposed but entailed difficulty in producing whiskers with a microscopic shape because of a high viscosity of the fusing agent at a high temperature which results in bulky crystals.

DISCLOSURE OF THE INVENTION

An object of the present invention is to provide priderite titanate whiskers.

Another object of the invention is to provide a priderite titanate whiskers having pores inside.

A further object of the invention is to provide a process for preparing priderite titanate whiskers.

A further object of the invention is to provide a process for preparing priderite titanate whiskers having a microscopic shape.

A further object of the invention is to provide a resin composition comprising a resin and priderite titanate whiskers.

A still further object of the invention is to provide a metal-matrix composite material formed from priderite titanate whiskers and aluminum or aluminum alloy.

According to the invention, there are provided titanate whiskers represented by the formula $$A'_vA''_wM^{II}_xM^{III}_yTi_{8-z}O_{16}$$

wherein $A'$ is at least one member selected from alkali metals, $A''$ is Ba, $M^{II}$ is at least one member selected from the group consisting of Mg, Co, Ni, Zn, Cu and Mn, $M^{III}$ is at least one member selected from the group consisting of Al, Sc, Cr, Fe and Ga, and v, w, x, y and z are real numbers which fulfill $0.5 \leq 2x+y \leq 2.5$, $2x+y=v+2w$, and $z=x+y$.

The titanate whiskers of the invention include those represented by the formula $$A'_vA''_wM^{II}_xM^{III}_yTi_{8-z}O_{16}$$

wherein $A'$, $A''$, $M^{II}$, $M^{III}$, v, w, x, y and z are as defined above, provided that the whiskers wherein w and x are both zero, $A'$ is K and $M^{III}$ is Al are excluded (hereinafter referred to as "titanate whiskers A") and potassium aluminum titanate whiskers having a make-up represented by the formula $$K_uAl_uTi_{8-u}O_{16}$$

wherein u is a real number which fulfills $0.8 \leq u \leq 2.5$ (hereinafter referred to as "titanate whiskers B").

According to the invention, there is provided a process for preparing titanate whiskers, comprising the steps of heating at a temperature of 900 to 1,300° C. potassium titanate fibers coated with compounds of metals $M^{II}$ and $M^{III}$ or potassium titanate fibers coated with compounds of metals $M^{II}$ and $M^{III}$ and compounds of metals $A'$ and $A''$ in the presence of at least one fusing agent selected from the group consisting of chlorides of alkali metals, sulfates of alkali metals and bromides of alkali metals to undergo a reaction for the growth of crystals, and cooling them (hereinafter referred to as "first producing process").

According to the invention, there is also provided a process for preparing titanate whiskers A, comprising the steps of heating at a temperature of 900 to 1,300° C. (a) at least one member selected from the group consisting of particulate or fibrous titanium source components represented by the formula $$TiO_2 \cdot nH_2O$$

wherein n is a real number of 0 to 8, (b) source components of metals $M^{II}$ and $M^{III}$ selected from the group consisting of hydroxides of metal $M^{II}$, hydroxides of metal $M^{III}$, hydrous oxides of metal $M^{II}$, hydrous oxides of metal $M^{III}$, inorganic acid salts of metal $M^{II}$, inorganic acid salts of metal $M^{III}$, composite oxide salts of alkali metals and metal $M^{II}$ and composite oxide salts of alkali metals and metal $M^{III}$, and optionally (c) source components of metals $A^{I}$ and $A^{II}$ selected from the group consisting of hydroxides of Ba, inorganic acid salts of Ba, sulfates of alkali metals, chlorides of alkali metals and bromides of alkali metals in the presence of a fusing agent essentially containing at least one member selected from the group consisting of sulfates of K and sulfates of Na to undergo a reaction for the growth of crystals, and cooling them (hereinafter referred to as "second producing process").

According to the invention, there is further provided a process for preparing titanate whiskers B, comprising the step of heating at a temperature of 900 to 1,300° C. potassium titanate fibers coated with an aluminum compound in the presence of at least one fusing agent selected from the group consisting of chlorides of alkali metals and sulfates of alkali metals to undergo a reaction for the growth of crystals (hereinafter referred to as "third producing processd").

The titanate whiskers of the invention are excellent in heat resistance, chemical resistance and reinforcing effect, low in coefficient of thermal conductivity and therefore very useful as reinforcing materials and thermal insulating materials for various composite materials.

According to the invention, there is also provided a resin composition comprising a resin and said titanate whiskers wherein the amount of the whiskers is 2 to 60% by weight of the combined amount of the resin and the whiskers.

Conventional composite materials prepared from a resin and calcium carbonate, mica, glass beads or the like suffer the drawbacks of having markedly low heat resistance and producing brittle molded products. Further, composite materials formed from a resin and glass fibers, carbon fibers or the like are defective. In this case, the anisotropy of the resin is scarcely improved; the surface of a molded product to be contacted with a finishing machine, a mold or the like is easily marred; and when molded, the fibers appear as a raised pattern on the surface of a molded product, leading to impaired surface smoothness and degraded appearance of the product. Potassium titanate and magnesium borate are weakly alkaline and aluminum borate is weakly acidic. Thus, when a composite material is formed from these fibers and a resin such as polycarbonate which easily decomposes due to an acid or an alkali, the fibers are likely to decompose the resin and to lower the strength.

The conjoint use of said titanate whiskers and a resin was found to increase the mechanical strength of the resulting molded product and to provide a resin composition whose molded product can be easily recycled and has superior surface properties. The products formed from the resin composition of the invention are outstanding in mechanical strength such as tensile strength, flexural strength, flexural modulus, Izod impact strength and compressive strength. Further the products can be easily recycled and possess good surface properties.

The present invention further provides a metal-matrix composite material prepared from said titanate whiskers and aluminum or aluminum alloy.

Among the whiskers or fibers which are used for a reinforcing purpose in the preparation of aluminum metal-matrix composite materials, silicon carbide whiskers, silicon nitride whiskers and aluminum oxide fibers are promising materials, but these materials are all expensive, consequently hindering wide applications in the fields of automobiles and construction materials excepting aerospace applications.

Silicon carbide whiskers, carbon fibers, aluminum oxide fibers and the like have a far lower coefficient of thermal expansion than aluminum. Thus, when used for forming a composite material, these whiskers or fibers have an advantage of controlling the coefficient of thermal expansion of the composite according to the theory of composite. On the other hand, since these whiskers and fibers widely differ from the matrix phase in the coefficient of thermal expansion, they are radically disadvantageous in easily becoming impaired in properties by thermal distortion due to a heat cycle of quickly heating and cooling.

While aluminum borate whiskers and potassium titanate whiskers are advantageous in that they can be manufactured at ⅕ to ¹⁄₂₀ the costs for preparing expensive fibers such as silicon carbide whiskers, these whiskers have such a small diameter of about 0.1 to about 1 μm that the whiskers show great resistance to impregnation in forming a composite by impregnation such as infiltration, thereby inducing cracking, deformation and the like in preparing a metal-matrix composite material, leading to a limitation of the producing process.

When said titanate whiskers are used as a reinforcing material for forming a composite using aluminum metals, aluminum metal-matrix composite materials having high tensile strength and heat resistance can be stably produced at low costs.

The titanate whiskers of the invention can be prepared, for example, by the first producing process, second producing process or third producing process.

The first producing process of the invention comprises the steps of coating potassium titanate fibers as a potassium source component and a titanium source component with compounds as source components of metals $M^{II}$ and $M^{III}$ (hereinafter collectively referred to as "metal M") or compounds as source components of metals $A^{I}$ and $A^{II}$ (hereinafter collectively referred to as "metal A"), heating the coated fibers in the presence of a specific fusing agent and cooling them, thereby giving titanate whiskers. In this process, the components are present in the closest contact with each other, allowing the reaction to efficiently proceed.

There is no specific limitation on the make-up of potassium titanate fibers which are used in the process as the potassium source component and as the titanium source component. That is to say, a wide variety of conventional potassium titanate fibers can be used in the process. For example, proper potassium titanate whiskers include those represented by $aK_2O \cdot TiO_2 \cdot mH_2O$ wherein a and m are numbers which fulfill $0 < a \leq 1$ or $0 \leq m \leq 10$. Such potassium titanate whiskers have a fiber diameter of 0.01 to 5 μm and a fiber length of 3 to 300 μm, preferably a fiber diameter of 0.1 to 3 μm and a fiber length of 5 to 200 μm. If a fiber diameter or a fiber length is too short, high cohesiveness results, and the obtained titanate whiskers are agglomerates which can not be easily isolated. Hence too short a fiber length or diameter is undesirable. If a fiber diameter or a fiber length is too long, it is difficult to uniformly coat the fibers with compounds used as metal M source component and metal A source component because of a lower surface activity in which case the unreacted oxides of metal M and metal A and potassium titanate tend to remain in the end product. Hence too long a fiber length or diameter is undesirable.

The potassium titanate fibers coated with a compound of metal M or with a compound of metal M and a compound of metal A can be produced, for example, by the following methods:

(a) a method comprising reacting potassium titanate fibers with at least one member selected from the group consisting of sulfates, halides, nitrates, hydroxides and alcoholates of metal M or metal M and Ba, and (b) a method comprising reacting at cost one member selected from the group consisting of sulfates, halides, nitrates, hydroxides and alcoholates of metal M or metal M and Ba with at least one member selected from the group consisting of hydroxides of alkali metals, carbonates of alkali metals, composite oxide salts of alkali metals and metal M, carbonates of ammonium, hydroxides of ammonium and carbon dioxide gas to deposit the basic salt of metal M on the surface of potassium titanate fibers.

Examples of useful sulfates of metal M and Ba which can be used herein are barium sulfate, aluminum sulfate, magnesium sulfate, cobalt sulfate, nickel sulfate, zinc sulfate, scandium sulfate, copper sulfate, manganese sulfate, chromium sulfate, gallium sulfate and iron sulfate. Examples of useful halides of metal M and Ba are barium chloride, aluminum chloride, magnesium chloride, cobalt chloride, nickel chloride, zinc chloride, scandium chloride, copper chloride, manganese chloride, chromium chloride, gallium chlorides and iron chloride. Examples of useful nitrates of metal M and Ba are barium nitrate, aluminum nitrate, magnesium nitrate, cobalt nitrate, nickel nitrate, zinc nitrate, scandium nitrate, copper nitrate, manganese nitrate, chromium nitrate, gallium nitrate and iron nitrate. Examples of useful hydroxides of metal M and Ba are barium hydroxide, aluminum hydroxide, magnesium hydroxide, cobalt hydroxide, nickel hydroxide, zinc hydroxide, scandium hydroxide, copper hydroxide, manganese hydroxide, chromium hydroxide, gallium hydroxide and iron hydroxide. Useful alcoholates of metal M and Ba include, for example, aluminum alcoholate, etc.

Examples of useful hydroxides of alkali metals are lithium hydroxide, sodium hydroxide, potassium hydroxide, rubidium hydroxide and cesium hydroxide. Examples of useful carbonates of alkali metals are lithium carbonate, sodium carbonate, potassium carbonate, rubidium carbonate and cesium carbonate. Examples of useful composite oxides of alkali metals and metal M are sodium aluminate and potassium aluminate. Useful carbonates of ammonium are, for example, ammonium carbonate and ammonium bicarbonate.

In coating the surface of potassium titanate fibers with the compound of metal M or with the compound of metal M and the compound of metal A, a method comprising dispersing the potassium titanate fibers in water to undergo a reaction is preferably employed. The compound of metal M is used in the reaction preferably in a molar ratio of 1:2 to 1:20 of the compound of metal M to titanium of potassium titanate fibers [when the compound of metal M and the compound of metal A (Ba compound and alkali metal compound) are used, the combined amount corresponds to said ratio]. The reaction for coating is allowed to proceed at 5 to 80° C., preferably 10 to 50° C. for about 1 to about 5 hours. When required, the potassium titanate fibers coated with the compound of metal M or the compound of metal M and the compound of metal A are washed with water or the like and dried before use in the subsequent step.

The fusing agent to be used in the first producing process is at least one member selected from the group consisting of chlorides of alkali metals, sulfates of alkali metals and bromides of alkali metals.

Useful chlorides of alkali metals are, for example, potassium chloride, sodium chloride, etc. Useful sulfates of alkali metals are, for example, potassium sulfate, sodium sulfate, etc. Useful bromides of alkali metals are, for example, potassium bromide, sodium bromide, etc. These fusing agents can be used either alone or in combination. The fusing agents may be used after they are ground into fine particles by a mill such as a jet mill. The fusing agent may be dissolved in water in the step of coating the potassium titanate fibers. A preferred amount of the fusing agent to be used is about 50 to about 90% by weight based on the total amount of the potassium titanate fibers coated with the compound of metal M or the compound of metal M and the compound of metal A.

The potassium titanate fibers coated with the compound of metal M or the compound of metal M and the compound of metal A are subjected to a reaction in the presence of said fusing agent at a temperature of 900 to 1,300° C. usually for about 10 minutes to about 10 hours, giving priderite titanate whiskers. When heated at lower than 900° C. in this reaction, the raw materials may partly remain unreacted, making it difficult to provide priderite titanate whiskers with homogeneous filaments. Hence, heating at lower than 900° C. is undesirable. If the reaction temperature is maintained at higher than 1,300° C. for a prolonged period of time, there would tend to occur welding of whiskers with each other, decrease of aspect ratio, formation of coarse crystals, production of polycrystals and so on. Hence the reaction at such high temperature is undesirable.

To produce titanate whiskers having pores in crystals, the reaction proceeds for the growth of crystals at a specific temperature and the reaction product is cooled or quenched using water to about 800° C. in a furnace at a cooling rate of not less than 10° C./min. In the cooling step, the volume ratio of the space occupied by pores in crystals can be controlled by properly adjusting the reaction temperature (temperature in the initiation of cooling) and the cooling rate. Whiskers having pores in crystals are very useful as reinforcing materials of low specific gravity or as a catalyst carrier or the like. On the other hand, for the production of potassium titanate whiskers free of pores in crystals, the reaction product is gradually cooled to about 800° C. at a cooling rate of not more than 10° C./min after reaction and crystal growth at a specific temperature.

The second producing process of the invention comprises the steps of heating a titanium source component, a metal M source component, and optionally a metal A source component in the presence of a fusing agent essentially containing at least one of sulfates of potassium and sulfates of sodium, and cooling the mixture to give titanate whiskers. This process produces titanate whiskers A.

In the second producing process, the titanium source component is a particulate or fibrous material represented by $TiO_2 \cdot nH_2O$ wherein n is as defined above. Specific examples of such materials are titania hydrate particles, monoclinic titanium oxide particles, fibrous materials thereof, etc. When a fibrous material is used as the raw material, a fibrous titanium oxide or a fibrous titanium hydroxide both prepared directly by a wet-type reaction, or these fibrous materials heat-treated can be suitably used.

A wide variety of conventional materials can be used as a metal M source component insofar as they can produce a metal M oxide on thermal decomposition. Examples of such materials are hydroxides such as aluminum hydroxide, magnesium hydroxide, cobalt hydroxide, nickel hydroxide, zinc hydroxide, scandium hydroxide, copper hydroxide, manganese hydroxide, chromium hydroxide, gallium hydroxide and iron hydroxide, hydrous oxides such as boehmite, diaspore and toddite, inorganic acid salts such as sulfates, nitrates, halides and water-insoluble basic salts of metal M, composite oxide salts of alkali metals and metal M, etc. Examples of useful sulfates, nitrates and halides of metal M include those exemplified in the first producing process and hydrates thereof. Examples of water-insoluble basic salts of metal M for use herein include those represented by the formula $$M.(X)_b.(OH)_c.dH_2O$$

wherein X is $SO_4$ or Cl, and b, c and d are numbers which fulfill $0.025 \leq b \leq 0.250$, $0.257 \leq c \leq 3.00$ or $0 \leq d \leq 2.0$. Examples of useful composite oxide salts of alkali metals and metal M are potassium aluminate, sodium aluminate, etc.

These metal M source components can be used either alone or in combination. These metal M source components can produce an active metal M oxide on thermal decomposition and allow the reaction to proceed at a lower temperature or in a shorter time than when a metal M oxide is directly used. Said metal M source component eliminates a need for a fusing component having a high fusing property such as potassium carbonate.

In the second producing process, the metal A source component is not essentially but optionally used together with the titanium source component and the metal M source component. The metal A source component is at least one member selected from the group consisting of hydroxides of Ba, inorganic acid salts of Ba (sulfates, halides, nitrates or the like) and sulfates, chlorides and bromides of alkali metals. Specific examples of such materials include the examples given above in the first producing process.

Useful fusing agents include those essentially containing at least one of sulfates of potassium and sodium. Specific examples of useful sulfates of potassium and sodium are potassium sulfate, sodium sulfate, sodium sulfate hydrate (containing ten molecules of water), sodium sulfite, sodium sulfite hydrate (containing 7 molecules of water), sodium pyrosulfate, sodium pyrosulfite, etc. The fusing agent to be used in the second producing process may contain potassium halide, sodium halide or the like. Specific examples of useful potassium halide and sodium halide are potassium chloride, sodium chloride, potassium bromide, sodium bromide, etc.

Preferably the compound of metal M is used in a molar ratio of 1:2 to 1:20 of compound of metal M:titanium of the titanium source component (when the compound of metal M and the compound of metal A are used, the combined amount of the two compounds corresponds to said molar ratio). However, when the compound of metal A contains sulfates, chlorides or bromides of potassium or sodium, the compound serves not only as the component A source but also as a fusing agent. Therefore, the amount of the compound of metal A is not limited to said range.

The fusing agent is used desirably in an amount corresponding to the combined amount of the metal A source component and the fusing agent which ranges from 30 to 95% by weight, preferably 50 to 80% by weight, based on their total amount. A preferred amount of the metal A source component is up to 30% by weight of the combined amount of the fusing agent and metal A source component except when the compound of metal A contains potassium or sodium.

The method of mixing the components as the raw materials is not specifically limited, but a preferred method is one which can provide the components as microscopically dispersed by mixing. From the viewpoint of microscopically dispersing the components, it is preferable to mix the components by a method including the step of mixing and grinding at the same time. Optionally a homogeneous dispersion of components may be provided by dissolving or dispersing the components in water or the like and evaporating the solution to dryness by drying methods using a spray, shelf or drum dryer or the like.

When the metal M source component is a water-insoluble basic salt of metal M represented by the formula $$M.(X)_b.(OH)_c.dH_2O$$

wherein X, b, c and d are as defined above, the titanium source component coated with the basic salt of metal M as the metal M source component utilizing the insolubility of the salt in water can be used, in addition to the alternative procedure of mixing the titanium source component with the other components merely by a dry mixing method. The coated component can be obtained by reacting, in an aqueous dispersion of a titanium source component, for example at least one member selected from the group consisting of sulfates, halides, nitrates, hydroxides and alcoholates of metal M with at least one member selected from the group consisting of hydroxides and carbonates of alkali metals, composite oxide salts of alkali metals and metal M, and carbonates and hydroxides of ammonium to deposit the basic salt of metal M on the titanium source component. The raw material prepared by this method is dried after or without washing the salt produced as a by-product in the production or is optionally dried after the addition of a metal A source component and/or a fusing agent. The mixture dried without the addition of a metal A source component and/or a fusing agent is added, when required, by a dry mixing method to provide a raw material. While there is no specific restriction on the make-up and the shape of the titanium source component to be used, it is desirable to use a fine particulate or fibrous material having a large specific surface area from the viewpoint of microscopically dispersing the components.

The heating conditions in the second producing process are heating at a temperature of 900 to 1,300° C., preferably 1,000 to 1,250° C. for about 10 minutes to about 10 hours, preferably about 30 minutes to about 5 hours, followed by cooling to room temperature. If the calcination temperature is too low, the powder components would partly remain unreacted, making it difficult to produce the desired whiskers with homogeneous filaments. Hence too low a calcination temperature is undesirable. Heating at too high a calcination temperature tends to result in welding between whiskers, decrease of aspect ratio and formation of coarse crystals and polycrystals and is therefore undesirable.

The third producing process comprises the steps of heating at a temperature of 900 to 1,300° C. potassium titanate fibers coated with an aluminum compound in the presence of at least one fusing agent selected from the group consisting of chlorides and sulfates of alkali metals to undergo a reaction for the growth of crystals, giving titanate whiskers. This process produces titanate whiskers B.

In the third producing process, the titanium source component is at least one of particulate or fibrous titanium source components represented by $TiO_2.nH_2O$ wherein n is as defined above. Specific examples of such components are titania hydrate particles, monoclinic titanium oxide particles, anatase titanium oxide particles, and rutile titanium oxide particles, and fibrous materials thereof. Even when a fibrous material is used as the raw material, the producing process is not specifically limited. Useful fibrous materials include, for example, titanium oxide and titanium hydroxide fibrous materials prepared directly by a wet-type reaction, heat-treated products of said fibrous materials and so on.

The aluminum source component is at least one member selected from aluminum hydroxides, hydrous aluminum oxides, inorganic acid salts of aluminum and aluminates of alkali metals. Useful aluminum hydroxides include, for example, aluminum hydroxide and the like. Useful hydrous aluminum oxides include boehmite (AlO(OH)), diaspore, toddite, etc. Examples of useful inorganic acid salts of aluminum are sulfates, nitrates, chlorides and water-insoluble basic salts of aluminum, etc. Examples of useful sulfates of aluminum are aluminum sulfate, aluminum sulfate hydrate (containing 14 to 18 molecules of water), potassium aluminum sulfate, potassium aluminum sulfate hydrate (containing 12 molecules of water), sodium aluminum sulfate, sodium aluminum sulfate hydrate (containing 12 molecules of water), aluminum ammonium sulfate, aluminum ammonium sulfate hydrate (containing 12 molecules of water), etc. Examples of useful nitrates of aluminum are aluminum nitrate, aluminum nitrate hydrate (containing 9 molecules of water), etc. Examples of useful chlorides of aluminum are aluminum chloride, aluminum chloride hydrate (containing 6 molecules of water), etc. Examples of useful water-insoluble basic salts of aluminum include those represented by the formula $$Al.(X)_b.(OH)_c.dH_2O$$

wherein X, b, c and d are as defined above. Examples of useful aluminates of alkali metals are potassium aluminate, sodium aluminate, etc. These aluminum source components can be used either alone or in combination. The aluminum source components decompose on exposure to heat in the atmosphere, giving an active aluminum oxide. The active aluminum oxide allows the reaction to proceed at a lower temperature or in a shorter time than when an aluminum oxide is directly used as the aluminum source component. The active aluminum oxide eliminates a need for a fusing agent component having a very high fusing ability such as potassium carbonate.

Used as the fusing agent is at least one member selected from the group consisting of chlorides, sulfates and bromides of potassium. Useful chlorides of potassium include potassium chloride, etc. Useful sulfates of potassium are potassium sulfate, potassium sulfite, potassium pyrosulfate, potassium pyrosulfite, etc. Useful bromides of potassium include potassium bromide, etc. In the invention, chlorides, sulfates and bromides of alkali metals can be conjointly used as the fusing agent. Useful chlorides of alkali metals include sodium chloride and lithium chloride as well as potassium chloride. Useful sulfates of alkali metals include sodium sulfate, sodium sulfate hydrate (containing 10 molecules of water), sodium sulfite, sodium sulfite hydrate (containing 7 molecules of water), sodium pyrosulfate, sodium pyrosulfite and lithium sulfate monohydrate as well as potassium sulfate. Useful bromides of alkali metals include sodium bromide as well as potassium bromide. According to the invention, these fusing agents can be used either alone or in combination.

The titanium source component and the aluminum source component are used in a molar ratio of titanium oxide:aluminum oxide of 18:1 to 22:5, preferably 14:1 to 6:1. The fusing agent is added in an amount of 30 to 95% by weight, preferably 50 to 80% by weight, of the total weight of the components. The amount of the potassium component present in the fusing agent (chlorides, sulfates or bromides of potassium) is at least 70% by weight, preferably at least 80% by weight, of the total weight of the fusing agent.

There is no specific limitation on the methods of mixing the titanium source component, the aluminum source component and the fusing agent. Any mixing methods can be employed insofar as the methods provide the source components and the fusing agent as microscopically dispersed after mixing. From the viewpoint of minutely dispersing the components, preferred methods are those wherein mixing and grinding are simultaneously carried out. An optional method comprises dissolving and dispersing the source components and the fusing agent and evaporating the solution to dryness by a drying method such as spray drying or drying method using shelves or a drum dryer, thereby providing component powders as homogeneously dispersed.

When the aluminum source component is a water-insoluble basic salt of aluminum represented by the formula $$Al.(X)_b.(OH)_c.dH_2O$$

wherein X, b, c and d are as defined above, it is desirable to employ the titanium source component coated with the basic salt of aluminum as the aluminum source component utilizing its water insolubility, in addition to the procedure of mixing the titanium source component with the fusing agent by a dry mixing method. The coated titanium source component can be obtained by reacting, in an aqueous dispersion of the titanium source component, for example at least one member selected from the group consisting of sulfates, halides, nitrates, hydroxides and alcoholates of aluminum with at least one member selected from the group consisting of hydroxides, carbonates and aluminates of alkali metals, and carbonates and hydroxides of ammonium to deposit the basic salt of aluminum on the titanium source component. The mixture obtained by such method is dried after or without washing the salt produced as a by-product in the production or is dried after the addition of the fusing agent. The mixture dried without the addition of a fusing agent is mixed with a specific amount of the fusing agent by a dry mixing method to provide powdery raw materials. While there is no specific restriction on the make-up and the shape of the titanium source component to be used herein, it is preferred to use a fine particulate or fibrous component having a large specific surface area from the viewpoint of microscopic mixing.

There is no specific limitation on the state of the raw materials, their shape and the calcining method in the calcination of the raw materials in the first, second or third producing process of the invention as described above. For example, calcining methods include a method of calcining the raw materials as powders, a method of calcining them after granulation, a method of calcining them as sheets or a method of calcining them as blocks. The granulating method can be exemplified by a method comprising granulating the raw materials using a mixer, a blender or the like having a stirring function while, when required, adding water or a binder which can be easily gasified by application of heat. The methods of making the raw materials into sheets include, for example, a method comprising forming the raw materials as compressed into a sheet or a method comprising molding them into a sheet using, e.g., an extruder after adding water or a binder capable of being easily gasified by application of heat. The methods of molding the raw materials into a block include, for example, a method comprising placing the raw materials into a specific mold without or after adding water or a binder capable of being easily gasified by application of heat and pressure molding them into a block.

The raw materials provided in the desired form are placed onto a heat-resistant container made of, e.g. ceramics or the like and are calcined as placed thereon using a tunnel-type continuous furnace, a batch-type furnace or the like. When the raw materials in the form of a powder or granules are used, they can be calcined in a rotary kiln or by a fluidization type calcining method. When the raw materials molded in a sheet are used, they are calcined by a method comprising feeding them onto a heat-resistant container, heat-resistant plate or the like and continuously calcining them.

To isolate the obtained titanate whiskers, the whiskers are treated with hot water, hot hydrochloric acid (about 1N), hot sulfuric acid (about 1N), hot nitric acid (about 1N), a hot aqueous solution (about 1N) of hydroxides of alkali metals such as potassium hydroxide or sodium hydroxide or the like to dissolve the water-soluble components such as the fusing agent, and the mixture is fractionated by a filter, washed with water, dried and when required, classified to remove the water and the diluted acid insolubles, thereby producing titanate whiskers microscopically shaped as desired.

The obtained titanate whiskers are mostly needle-like single crystals having a fiber diameter of 0.1 to 10 $\mu$m and a fiber length of 5 to 300 $\mu$m, and an aspect ratio of 10 to 100 and are excellent in reinforcing capability, heat resistance, heat insulation and chemical resistance. Consequently these whiskers can be suitably used for various applications.

The resin composition of the present invention comprises a resin and said titanate whiskers wherein the amount of whiskers is 2 to 60% by weight of the total amount of the resin and the whiskers.

The resin to be used in the perception is not specifically limited and is at least one species selected from thermoplastic resins and thermosetting resins. Thermoplastic resins to be used include a wide variety of conventional resins. Preferred examples are general purpose type plastics such as polyethylenes, polypropylenes and polyvinyl chlorides, engineering plastics such as polyamides, ABS resins, thermoplastic polyesters, polycarbonates, polyacetals, polyphenylene sulfides, polyphenylene ethers, polysulfones, polyether sulfones, polyetherimides, polyether ether ketones and so on. Thermosetting resins include a wide range of conventional resins. Preferred examples are epoxy resins, unsaturated polyesters, vinyl esters, phenols, alkyds, silicones, diallylphthalates, bismaleimide triazineimide resins, polyamides, urea, melamine-containing resins, polyurethanes, etc. Polymer alloys which can be used as thermosetting resins include composites formed from different resins such as polycarbonate-ABS resin composites and polyphenylene ether-polystyrene composites.

Suitable titanate whiskers to be incorporated in the resin composition of the invention are needle-like single crystals having an average fiber diameter of 0.05 to 10 $\mu$m, preferably 0.1 to 10 $\mu$m, an average fiber length of 5 to 300 $\mu$m, preferably 10 to 100 $\mu$m and an average aspect ratio of 10 to 100. Such whiskers may have 0 to 70% by volume of pores. In preparing a molded product with a precisely dimensional or microscopic shape, or in using the molded product in applications which require a high surface smoothness, it is desirable to use titanate whiskers having a fiber diameter of 0.3 to 5 $\mu$m and a fiber length of 10 to 50 $\mu$m. From the viewpoint of dispersibility in the resin, preferred whiskers include those free of agglomerates such as bundles of hairs and those isolated with filaments separated.

The titanate whiskers of the invention are preferably surface-treated with coupling agents to increase the mechanical strength of the desired product. Preferred examples of useful surface-treating agents are coupling agents such as silane type, titanate type, aluminum type, zirconium type, zircoaluminum type, chromium type, boron type, phosphorus type, amino acid type and so on.

Desired methods of treating the surface of titanate whiskers with a coupling agent can be employed. Preferred methods include, for example, a method comprising placing titanate whiskers into an agitation device fitted with a spray coater, and spraying the whiskers with a coupling agent with stirring, a method comprising dissolving a coupling agent in water or an organic solvent, immersing the titanate whiskers in the solution and drying the wet whiskers to remove the water or the organic solvent, and a method comprising mixing a coupling agent with titanate whiskers at a temperature in the range of room temperature to about 250° C.

The amount of the coupling agent to be used may vary depending on the shape of whiskers, type of resins, coupling agent and method of making a composite and may vary from 0.01 to 15 parts by weight, preferably 0.1 to 10 parts by weight, per 100 parts by weight of the titanate whiskers.

The amount of the titanate whiskers to be mixed with the resin in the invention is 2 to 60% by weight, preferably 5 to 50% by weight, more preferably 10 to 40% by weight, based on the resin composition in view of an effect of reinforcing the resin, particularly rigidity, resistance to creep, elevation of the thermal deformation temperature, increase of critical PV value and improvement in dimensional accuracy. The amount of less than 2% by weight fails to fully enhance the mechanical strength of cured products of the resin composition, whereas the amount exceeding 60% by weight can scarcely improve the mechanical strength over the corresponding effect and raises a problem of making it difficult to granulate the composition. Hence the amount outside said range is undesirable.

When required, the composition of the invention may suitably contain fillers such as talc, mica, wollastonite and calcium carbonate, reinforcing materials such as glass fibers and carbon fibers, pigments, antioxidants, antistatic agents, lubricants, heat stabilizers, flame retardants, etc.

In preparing the composition of the invention, conventional mixing methods such as those using a Banbury mixer, an internal mixer or the like and extrusion granulation method may be suitably carried out.

The resin composition of the invention finds applications in electrical parts, automotive parts, building materials and like structural materials, sliding materials, decorating materials, etc. because of its high mechanical strength such as tensile strength and flexural strength.

The composite material of the invention is prepared by making titanate whiskers and aluminum or aluminum alloy into a composite.

It is appropriate that the aluminum powder or aluminum alloy powder to be used as a matrix material in the invention have a particle size of up to 44 $\mu$m, preferably up to 20 $\mu$m. Aluminum or aluminum alloy powder with a less oxidized surface is proper in sintering degree.

The foregoing titanate whiskers have improved strength, good flexibility and high melting point and are very useful as materials for reinforcing matrices. These whiskers have said properties and would scarcely impair the fiber shape under high temperature conditions. The shape of a pressure-molded product of aluminum powder and/or aluminum alloy powder (hereinafter referred to as "aluminum metal powder") and titanate whiskers which is used in preparing a metal-matrix composite material can be reproduced in a composite material. Further the shape of a preform to be used in preparing a metal-matrix composite material by a forging cast process can be reproduced in a composite material.

The shape of titanate whiskers to be used herein can be suitably selected depending on the conditions for preparing the metal-matrix composite material of the invention. Usually the whiskers having a fiber diameter of 0.1 to 10 μm and a fiber length of 5 to 100 μm are used. It is desirable to employ the whiskers 0.3 to 5 μm in fiber diameter and 10 to 50 μm in fiber length when preparing a metal-matrix composite material by a forging cast process. Suitable whiskers are those free of agglomerates such as bundles of fibers and those isolated with filaments separated from the viewpoint of dispersibility in the resin.

The metal-matrix composite material of the invention can be prepared, for example, by the following processes.

According to the first process, the metal-matrix composite material of the invention can be prepared by molding a powder mixture of aluminum metal powder and titanate whiskers at room temperature and sintering the molded body at a high temperature in a non-oxidizing atmosphere or a reducing atmosphere under pressure or without increase of pressure.

While the mixing ratio of the aluminum metal powder and titanate whiskers is not critical, the latter is used in an amount of 5 to 40% by weight, preferably 10 to 35% by weight, based on the total amount of the mixture. A high reinforcing effect is produced when the mixing ratio of the aluminum metal powder and titanate whiskers is in the above range. Although the two components can be mixed by either a wet mixing method or a dry-type mixing method, a wet mixing method using a solvent is suited to uniformly mix them and to prevent the oxidation of aluminum metal powder. Preferred are polar solvents in view of the affinity for the titanate whiskers and aluminum metal powder. Specific examples are alcohols and ketones, and more specific examples are ethyl alcohol, methyl alcohol, isopropyl alcohol, acetone, methyl ethyl ketone, etc. which are most suitable. To the solvent are added the aluminum metal powder and titanate whiskers in predetermined amounts. The mixture is uniformly dispersed mechanically, preferably by being irradiated with ultrasonics, or using a ball mill or the like. The amount of the solid is adjusted to 3 to 30% by volume of the solvent. To provide a dry mixture, the solvent is removed from the obtained slurry preferably by quick suction filtration of the slurry and drying it, or by evaporating the slurry to dryness while retaining the components of the slurry as dispersed.

The powder mixture is molded at room temperature. The molding can be performed under pressure or without increase of pressure. In molding under pressure, the powder mixture is molded by conventional molding methods using a mold. A favorable molding pressure is about 0.3 to about 10 tons/cm$^2$.

The molded product thus obtained is sintered by conventional methods such as a hot plate method, HIP sintering method or method involving application of heat without increase of pressure. Sintering is performed in a non-oxidizing atmosphere comprising, e.g. nitrogen or argon or a reducing atmosphere comprising hydrogen in order to prevent the oxidation of metal. While the sintering temperature is variable depending on the type of the sintering method, the type of aluminum metal powder to be sintered and other factors and is not determinable, it is usually in the range of 500 to 800° C., preferably 580 to 630° C. The sintering time is usually 5 minutes to 3 hours.

According to the second process, the metal-matrix composite material of the invention can be prepared by molding a preform containing the titanate whiskers as the main component and impregnating the preform with molten aluminum alloy under pressure in the mold.

An aluminum alloy of high flowability for use in cast molding is used as an aluminum metal alloy in the second process. A preform can be molded by a method comprising mixing the titanate whiskers with a small amount of a surfactant, dispersing them in water with stirring, and molding the dispersion in a mold in a manner involving dehydration. Useful surfactants include anionic surfactants such as higher fatty acid alkali salt, alkyl sulfate, alkyl sulfonate, alkylaryl sulfonate and sulfosuccinic acid ester; cationic surfactants such as higher amine halogen acid salt, halogenated alkyl pyridinium and quaternary ammonium salt; nonionic surfactants such as polyethylene glycol alkyl ether, polyethylene glycol fatty acid ester, sorbitan fatty acid ester and fatty acid monoglyceride; and amphoteric surfactants such as amino acids. Preferably 0.05 to 2.0% by weight of a solution of polyvinyl alcohol is added to increase the strength of molded product at room temperature, while 0.05 to 5.0% by weight of an inorganic binder such as colloidal silica and alumina sol is added to increase the strength of molded product at a high temperature, after which the fibers are well dispersed and the dispersion is molded in a mold which involves dehydration. A preform for use in a forging cast process can be prepared by removing the remaining water from the molded product obtained by dehydration molding at a temperature at which water can be evaporated. When colloidal silica or alumina sol is added, the mixture is heat-treated at 300 to 1,000° C., preferably 500 to 800° C., whereby a preform having enhanced strength can be produced. Desirable conditions for forging cast (impregnation under pressure) are a pressure of 50 to 2,000 kg/cm$^2$, preferably 500 to 1,200 kg/cm$^2$, a molten metal temperature of 600 to 900° C., preferably 700 to 850° C., a mold temperature of 100 to 600° C., preferably 150 to 550° C., and a favorable preheating temperature of the preform which is substantially equal to the molten metal temperature.

In this way, the metal-matrix composite material of the invention is prepared.

According to the invention, a fiber-reinforced metal-matrix composite material having high mechanical strength can be produced at low costs and with stability using aluminum or aluminum alloy and relatively inexpensive titanate whiskers.

BEST MODE FOR CARRYING OUT THE INVENTION

The present invention will be described below in more detail with reference to the following Examples.

EXAMPLE 1

A 200 g quantity of potassium hexatitanate (product of Otsuka Kagaku Kabushiki Kaisha, "TISMO-N") was dispersed in 2.5 liters of water, followed by addition of 228.4 g of ammonium bicarbonate. To the mixture was gradually added with stirring 400 ml of an aqueous solution of 188.5 g of aluminum chloride hexahydrate to undergo a reaction. The reaction was continued for 3 hours while retaining the reaction temperature at 30 to 40° C. After completion of the reaction, the pH of the reaction mixture was 7.4. The reaction mixture was filtered, washed with water to remove the impurities and dried at 80° C., giving 263.0 g of a dry reaction product. The analysis of the product showed that potassium hexatitanate was coated with 15.1%, calculated as aluminum oxide, of an aluminum hydroxide compound containing 0.003% of sulfate and having a weight decrease of 8.09% on exposure to intense heat.

The potassium hexatitanate fibers coated with the aluminum hydroxide compound was fully mixed with potassium sulfate ($K_2SO_4$) by a mortar in a weight ratio of 1:4. Then the mixture was pressure-molded and was calcined at 1,150° C. for 3 hours. After calcination, the molded product was cooled at a rate of 5° C./min to a temperature of 800° C. and further cooled in a furnace to room temperature, giving a calcined product. The calcined product was boiled in water, washed with water, fractionated by filtration and dried, giving a pale yellow powder. The powder was found by X ray diffraction and elementary analysis to be potassium aluminum titanate whiskers of the formula $K_{2.0}Al_{2.0}Ti_{6.0}O_{16}$ having an average fiber diameter of 2 $\mu$m and an average fiber length of 30 $\mu$m.

EXAMPLE 2

A reaction was conducted under the same conditions as in Example 1 except that the calcined product was quickly cooled in cold water after withdrawal from the furnace, whereby a pale yellow powder was produced. The powder was found by X ray diffraction and elementary analysis to be potassium aluminum titanate whiskers of the formula $K_{2.0}Al_{2.0}Ti_{6.0}O_{16}$ having an average fiber diameter of 2 $\mu$m and an average fiber length of 30 $\mu$m and containing about 50% by volume, based on the total volume of the whiskers, of pores in the crystals.

EXAMPLE 3

In 2.5 liters of water was dispersed 200 g of potassium octatitanate whiskers (product of Otsuka Kagaku Kabushiki Kaisha, "TISMO-D"). Gradually added were 110 ml of an aqueous solution of 47.3 g of aluminum sulfate hydrate (containing 18 molecules of water) and 100 ml of a solution of 16.6 g of sodium aluminate ($Na_2O.Al_2O_3$) and 5.2 g of sodium hydroxide with stirring at a temperature of 20 to 30° C. to give a pH of 7 to 9 to a reaction mixture. The reaction was continued for 5 hours. The pH of the reaction mixture was 7.2 after completion of the reaction. The reaction mixture was filtered, washed with water to remove the impurities and dried at 90° C., giving 238.8 g of a dry reaction product. The analysis of the product showed that potassium octatitanate was coated with 7.36%, calculated as aluminum oxide, of a basic aluminum sulfate compound containing 3.31% of sulfate and having a weight decrease of 5.19% on exposure to intense heat.

A powder mixture of potassium chloride (KCl) and potassium sulfate ($K_2SO_4$) in a molar ratio of 1:3 was added to said product in a weight ratio of 1:9 and fully mixed in a mortar. Then the mixture was pressure-molded and was calcined at 1,250° C. for 3 hours. After calcination, the molded product was cooled at a rate of 1° C./min to a temperature of 800° C. and further cooled in a furnace to room temperature, giving a calcined product. The calcined product was boiled in water, washed with water, fractionated by filtration and dried, giving a pale yellow powder. The powder was found by X ray diffraction and elementary analysis to be potassium aluminum titanate whiskers of the formula $K_{1.0}Al_{1.0}Ti_{7.0}O_{16}$ having an average fiber diameter of 3 $\mu$m and an average fiber length of 50 $\mu$m.

EXAMPLE 4

In 2 liters of water was dispersed 100 g of potassium hexatitanate whiskers (product of Otsuka Kagaku Kabushiki Kaisha, trade name "TISMO-N" having an average fiber length of 20 $\mu$m and an average diameter of 0.3 $\mu$m). Then, 30.4 g of magnesium chloride hexahydrate was added and 100 ml of an aqueous solution of 16.8 g of potassium hydroxide was gradually added dropwise with stirring to undergo a reaction. The reaction was continued for 3 hours while retaining the reaction temperature at 30 to 40° C. The pH of the reaction mixture was 10.8 after completion of the reaction. The reaction mixture was filtered, washed with water to remove the impurities and dried at 80° C., giving 109 g of a dry reaction product. The product was analyzed by an energy dispersive X ray spectrometer (EDS) under an electron microscope and subjected to elementary analysis. The results showed that potassium hexatitanate fibers were coated with 5.5%, calculated as magnesium oxide, of a basic salt of magnesium having a weight decrease of 2.0% on exposure to intense heat.

Figure 1:
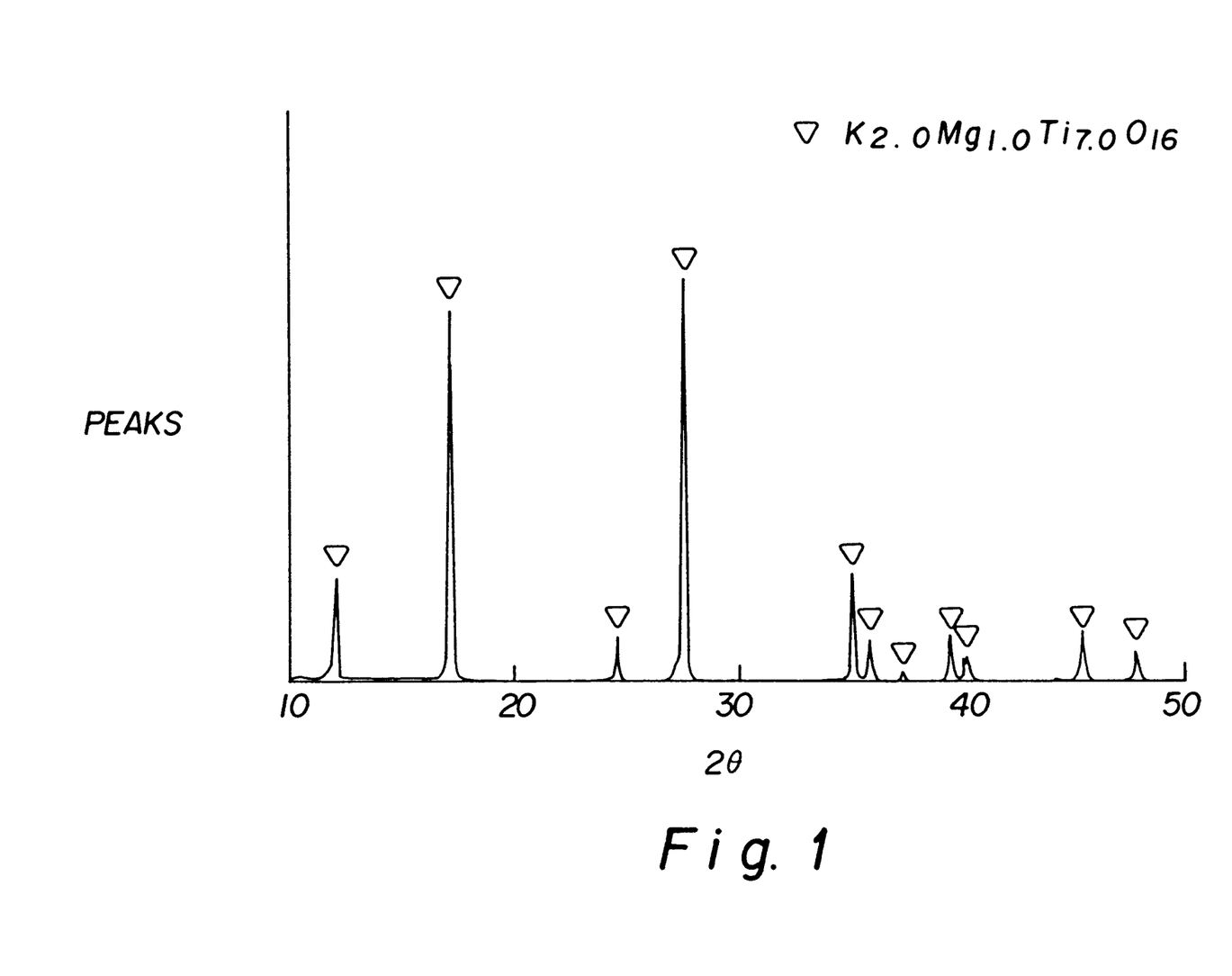
FIG. 1 is a graph showing the peaks in a diffraction pattern of the titanate whiskers prepared in Example 4, the pattern being produced by a powder X-ray diffractometer.
Figure 2:
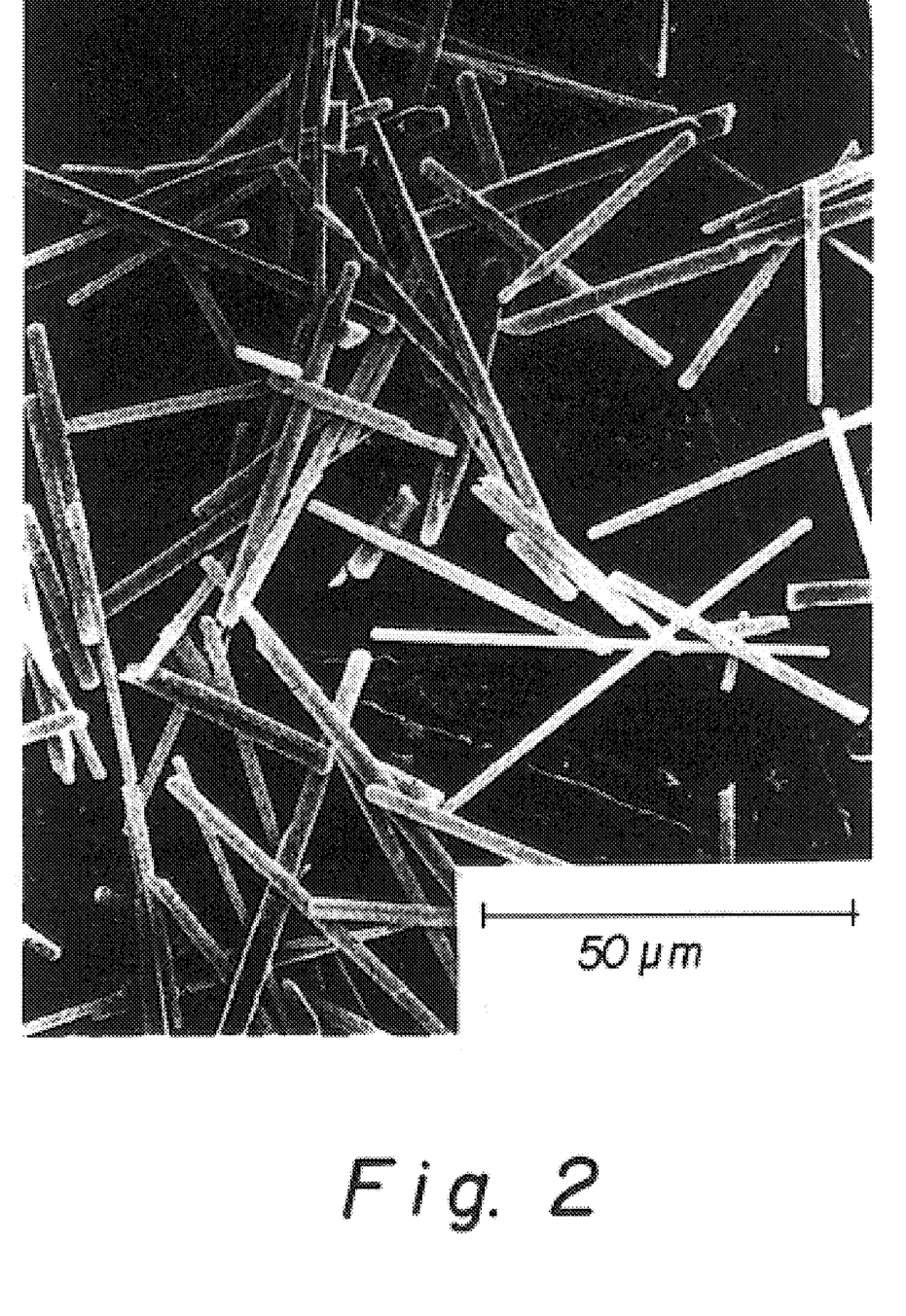
FIG. 2 is an electron microphotograph of the titanate whiskers prepared in Example 4.

Potassium sulfate ($K_2SO_4$) was added as a fusing agent to the fibers in a weight ratio of 1:4 and fully ground and mixed in a mortar. The mixture was pressure-molded and was calcined at 1,150° C. for 3 hours. After calcination, the molded product was cooled at a rate of 1° C./min to a temperature of 800° C. and further cooled in a furnace to room temperature, giving a calcined product. The calcined product was boiled in water, washed with water, fractionated by filtration and dried, giving a pale yellow powder. The powder was found by X ray diffraction and elementary analysis to be titanate whiskers of the formula $K_{2.0}Mg_{1.0}Ti_{7.0}O_{16}$ having an average fiber diameter of 3 $\mu$m and an average fiber length of 60 $\mu$m. FIG. 1 shows the peaks in a diffraction pattern of said titanate whiskers, the pattern being produced by a powder X-ray diffractometer. An electron microphotograph of said titanate whiskers is shown in FIG. 2.

The powder was cooled after calcination under the same conditions except that the calcined powder was quickly cooled in cold water after withdrawal from the furnace, whereby a pale yellow powder was produced. The powder was found by X ray diffraction and elementary analysis to be titanate whiskers of the formula $K_{2.0}Mg_{1.0}Ti_{7.0}O_{16}$ having an average fiber diameter of 3 $\mu$m and an average fiber length of 60 $\mu$m and containing about 50% by volume, based on the total volume of the whiskers, of pores in the crystals.

EXAMPLE 5

In 2 liters of water was dispersed 100 g of potassium tetratitanate monohydrate fibers (product of Otsuka Kagaku Kabushiki Kaisha, trade name "TISMO-L" having an average fiber length of 20 $\mu$m and an average diameter of 0.3 $\mu$m). Then, 300 ml of an aqueous solution of 57.0 g of chromium chloride hexahydrate was gradually added to the dispersion with stirring to give a reaction mixture. The reaction was continued for 3 hours while retaining the reaction temperature at 10 to 20° C. After completion of the reaction, 300 ml of an aqueous solution of 33.7 g of barium hydroxide octahydrate was gradually added to the reaction mixture with stirring while blowing carbon dioxide gas into the reaction mixture at a flow rate of 100 ml/min. In the meantime, the reaction was continued for 2 hours while the reaction temperature was maintained at 10 to 20°. After completion of the reaction, the reaction mixture was filtered, washed with water to remove the impurities and dried at 80° C., giving 143 g of a dry reaction product. The product was analyzed and found to be potassium tetratitanate monohydrate fibers coated with 11.4%, calculated as chromium oxide, of a basic salt of chromium and 11.3%, calculated as barium oxide, of barium carbonate having a weight decrease of 7.4% on exposure to intense heat.

A mixture of potassium sulfate ($K_2SO_4$) and potassium chloride (KCl) as a fusing agent (weight ratio of 3:1) was mixed with said fibers in a weight ratio of 1:4. The resulting mixture was fully ground and mixed in a mortar. The mixture was pressure-molded and was calcined at 1,200° C. for 2 hours. After calcination, the molded product was cooled at a rate of 1° C./min to a temperature of 800° C. and further cooled in a furnace to room temperature, giving a calcined product. The calcined product was boiled in water, washed with water, fractionated by filtration, and dried, giving a pale yellow powder. The obtained powder was found by X ray diffraction and elementary analysis to be titanate whiskers of the formula $Ba_{0.68}K_{0.15}Ti_{6.5}O_{16}$ having an average fiber diameter of 3 μm and an average fiber length of 50 μm.

EXAMPLE 6

Anatase titanium oxide powder (average particle size 0.7 μm) was mixed with iron chloride hexahydrate ($FeCl_3 \cdot 6H_2O$) in a molar ratio of 4:1. Added was a mixture of sodium sulfate ($Na_2SO_4$) and potassium chloride (KCl) in a weight ratio of 4:1 in an amount of 70% by weight based on the total amount of the components. The mixture was fully mixed in a mortar and placed into a mixer having agitating blades. Water was added with stirring in an amount of 10% by weight based on the total amount of the mixture, followed by granulation. The obtained granules were held in a dryer heated to 120° C. for 10 hours, and used as the raw material in the subsequent step.

The granules obtained in the foregoing step were charged into a crucible of alumina and calcined at 1,250° C. for 5 hours. After calcination, the product was cooled at a rate of 1° C./min to a temperature of 800° C. and further cooled in a furnace to room temperature, giving a calcined product. The calcined product was boiled in water, washed with water, fractionated by filtration and dried, giving a pale yellow powder. The powder was found by X ray diffraction and elementary analysis to be titanate whiskers of the formula $Na_{1.28}K_{0.32}Fe_{1.6}Ti_{6.4}O_{16}$ containing potassium and sodium in a molar ratio of 4:1 and having an average fiber diameter of 10 μm and an average fiber length of 200 μm.

Reference Example

Anatase titanium dioxide powder (average particle size 0.7 μm) was mixed with potassium carbonate powder (average particle size 3 μm) in a molar ratio of 4:1. A fusing agent of the formula $K_2MoO_4$ was added in a molar ratio of 1:8. The mixture was charged into a crucible of platinum and calcined at 1,100° C. for 4 hours. The product was cooled at a rate of 4° C./hr to a temperature of 900° C. and further cooled to room temperature, giving a calcined product.

The calcined product was separated into filaments in water, fractionated by filtration, washed with water to remove the impurities and the fusing agent and dried, giving a white powder. The obtained fibrous material was identified by powder X ray diffraction to confirm that the material consisted of a phase of $K_2Ti_4O_9$ and had an average fiber diameter of 0.4 μm and an average fiber length of 20 μm.

The obtained material was added to a 1N solution of acetic acid in an amount of 5 g per 100 ml of the solution. The $K_2O$ component was extracted with stirring for about 3 hours. Then, the mixture was fractionated by filtration, washed and dried to give titania hydrate A fibers. The obtained fibers were identified by X ray diffraction to confirm that the fibers consisted of a phase of $H_2Ti_4O_9$. The fibers had an average fiber diameter of 0.4 μm and an average fiber length of 18 μm.

EXAMPLE 7

In 2 liters of water was dispersed 100 g of the titania hydrate fibers prepared in Reference Example. Added were 43.4 g of barium chloride dihydrate and 40.1 g of nickel chloride hexahydrate. Then, 300 ml of an aqueous solution of 39.9 g of potassium hydroxide was gradually added with stirring to undergo a reaction. The reaction was continued for 3 hours at a reaction temperature maintained at 30 to 40° C. After the reaction, a further reaction was conducted for 2 hours while blowing carbon dioxide gas into the reaction mixture at a flow rate of 100 ml/min. After completion of the reaction, the reaction mixture was filtered, washed with water to remove the impurities and dried at 80° C., giving 156 g of a dry reaction product. The product was analyzed and found to be titania hydrate fibers coated with 8.3%, calculated as nickel oxide, of a basic salt of nickel and 16.8%, calculated as barium oxide, of barium carbonate having a weight decrease of 9.9% on exposure to intense heat.

Potassium sulfate was added as a flux component to said fibers in a weight ratio of 1:4. The mixture was fully mixed and ground in a mortar, pressure-molded and calcined at 1,200° C. for 3 hours. After calcination, the product was cooled at a rate of 1° C./min to a temperature of 800° C. and further cooled in a furnace to room temperature, giving a calcined product. The calcined product was boiled in water, washed with water, fractionated by filtration, and dried, giving a bright green powder. The obtained powder was found by X ray diffraction and elementary analysis to be titanate whiskers of the formula $Ba_{0.8}K_{0.4}Ni_{1.0}Ti_{7.0}O_{16}$ having an average fiber diameter of 3 μm and an average fiber length of 80 μm.

A reaction was conducted under the same conditions except that the calcined product was quickly cooled in cold water after withdrawal from the furnace, whereby a bright green powder was produced. The powder was found by X ray diffraction and elementary analysis to be titanate whiskers of the formula $Ba_{0.8}K_{0.4}Ni_{1.0}Ti_{7.0}O_{16}$ having an average fiber diameter of 3 μm and an average fiber length of 80 μm and containing about 30% by volume, based on the total volume of the whiskers, of pores in the crystals.

EXAMPLE 8

In 250 ml of water was dispersed 10 g of the titania hydrate fibers prepared in Reference Example. Fifty ml of an aqueous solution of 6.75 g of anhydrous aluminum sulfate ($Al_2(SO_4)_3$) and 10 ml of an aqueous solution of 1.56 g of sodium hydroxide (NaOH) were gradually simultaneously added to the dispersion with stirring to undergo a reaction. The reaction was continued for 3 hours at a reaction temperature maintained at 30 to 40° C. On completion of the reaction, the reaction product had a pH of 7.63. A small amount of the reaction product at this point was taken out, filtered, washed with water and dried. A chemical analysis of the dry product showed that the product consisted of titania hydrate fibers and a water-insoluble basic salt of aluminum represented by $Al.(SO_4)_{0.151}.(OH)_{2.85}.0.4H_2O$. After completion of the reaction, 31 g of potassium sulfate ($K_2SO_4$) and 12.5 g of potassium bromide were added. The mixture was held at room temperature for 15 minutes. The slurry thus prepared was placed into a container of stainless steel and dried at 80° C. for 12 hours by a drier to remove the water. The dry product was fully ground by a mortar to give a powder. The obtained powder was analyzed by an energy dispersive X ray analyzer (EDS) using an electron microscope. The results showed that an aluminum component was predominantly present on the surface of the titania hydrate fibers and that potassium sulfate and potassium chloride were uniformly dispersed in the powder.

The obtained powdery raw materials were charged into a crucible of alumina and heated in an electric furnace to 1,150° C. at a rate of 5° C./min. The powder was maintained at 2 hours at the same temperature and cooled to 800° C. at a rate of 10° C./min. The product was further cooled in a furnace to room temperature, giving a calcined product. The calcined product was boiled in water, washed with water, fractionated by filtration to remove the fusing agent and dried, giving a pale yellow powder. The powder was found by X ray diffraction and elementary analysis to be potassium aluminum titanate whiskers of the formula $K_{2.0}Al_{2.0}Ti_{6.0}O_{16}$ having an average fiber diameter of 1 μm and an average fiber length of 20 μm.

EXAMPLE 9

Anatase titanium dioxide powder (average particle size 0.7 μm) was mixed with aluminum hydroxide ($Al(OH)_3$) in a molar ratio of 7:1. Potassium chloride was added as a fusing agent in an amount of 70% by weight based on the total amount of the mixture. The mixture was charged into a ball mill of porcelain and water was added to produce a slurry in a concentration of 30% by weight. The slurry were mixed and ground by the ball mill for 12 hours after which the slurry was dried by spray-drying method to give a dry powder. The dry powder was placed into a cylindrical mold of 60 mm in inside diameter and pressure-molded into a cylindrical molded product of 60 mm in outer diameter and a thickness of 10 mm. The obtained molded product was placed into a crucible of alumina and heated to 1,000° C. at a rate of 5° C./min in an electric furnace. After the product was held at the same temperature for 1 hour, it was cooled at a rate of 10° C./min to 800° C. and gradually further cooled to room temperature (20° C.), giving a calcined product. The calcined product was boiled in water, washed with water, fractionated by filtration to remove the fusing agent, and dried, giving a pale yellow powder. The obtained powder was found by X ray analysis and elementary analysis to be potassium aluminum titanate whiskers of the formula $K_{1.0}Al_{1.0}Ti_{7.0}O_{16}$ having an average fiber diameter of 2 μm and an average fiber length of 30 μm.

EXAMPLE 10

Rutile titanium dioxide powder (average particle size 1.2 μm) was mixed with aluminum nitrate ($Al(NO_3)_3.9H_2O$) in a molar ratio of 6.5:1.5. A powder mixture of potassium sulfate and sodium sulfate as a fusing agent (weight ratio of 5:1) was added in an amount of 75% by weight based on the total amount of the mixture. While stirring the resulting powder mixture by a mixer, water was added in an amount of 8% by weight based on the total amount of the mixture, followed by granulation. After the granules were dried at 100° C. for 10 hours, the dried granules were placed into a sheath of alumina to a thickness of 50 mm and heated to 1,200° C. at a rate of 5° C./min in an electric furnace. After the product was held at the same temperature for 2 hours, it was cooled at a rate of 20° C./min to 800° C. and gradually further cooled to room temperature (20° C.), giving a calcined product. The calcined product was boiled in water, washed with water, fractionated by filtration to remove the fusing agent and dried, giving a pale yellow powder. The resulting powder was found by X ray analysis and elementary analysis to be potassium aluminum titanate whiskers of the formula $K_{1.5}Al_{1.5}Ti_{6.5}O_{16}$ having an average fiber diameter of 2 μm and an average fiber length of 50 μm.

EXAMPLE 11

Anatase titanium dioxide powder (average particle size 0.7 μm) was mixed with potassium aluminate trihydrate ($KAlO_3.3H_2O$) in a molar ratio of 6:2. Potassium sulfate was added as a fusing agent in an amount of 80% by weight based on the total amount of the mixture. The mixture was charged into a beaker and water was added to produce a slurry in a concentration of 30% by weight. The slurry was mixed with stirring for 1 hour, and then dried by spray-drying method to give a dry powder. The dry powder was placed into a sheath of alumina to a thickness of 10 mm. The obtained molded product was heated to 1,250° C. at a rate of 10° C./min in an electric furnace. After the product was held at the same temperature for 3 hours, it was cooled at a rate of 5° C./min to 800° C. and gradually cooled to room temperature (20° C.), giving a calcined product. The calcined product was boiled in water, washed with water and fractionated by filtration to remove the fusing agent and dried, giving a pale yellow powder. The obtained powder was potassium aluminum titanate whiskers having an average fiber diameter of 3 μm and an average fiber length of 80 μm.

EXAMPLES 12 to 15 and Comparative Example 1

Highly crystalline polypropylene K5230 (HCPP, product of Chisso Co. Ltd.) was placed into a twin-screw extruder of 45 mm diameter set to 220° C., together with the potassium aluminum titanate whiskers prepared in Example 1 and surface-treated with 1% of a titanate coupling agent (TTS, product of Ajinomoto Co., Inc.) in the amount shown below in Table 1. Molten K5230 and the whiskers were extruded in the extruder to form granules. The granules were injection molded under the following conditions to produce test pieces for evaluating the properties.

Cylinder temperature: 210° C.
Injection pressure: 500 kg/cm$^2$
Injection time: 15 sec
Mold temperature: 60° C.

The mechanical strength of the obtained test pieces was evaluated with the results shown in Table 1.

The tensile strength, flexural strength, flexural modulus and IZOD impact strength of the test pieces in the Examples were measured according to JIS K-7113, JIS K-7203 and JIS K-7110.

TABLE 1

|  | Com. Ex. 1 | Ex. 12 | Ex. 13 | Ex. 14 | Ex. 15 |
|---|---|---|---|---|---|
| Amount of potassium aluminum titanate whiskers (wt %) | 0 | 5 | 10 | 20 | 40 |
| Tensile strength (kgf/cm$^2$) | 310 | 350 | 370 | 420 | 440 |
| Flexural strength (kgf/cm$^2$) | 470 | 540 | 570 | 630 | 710 |
| Flexural modulus (kgf/cm$^2$) | 16,600 | 23,100 | 29,700 | 44,000 | 73,000 |
| IZOD notched impact value (kgf cm/cm) | 4.0 | 3.7 | 3.2 | 3.0 | 2.8 |

EXAMPLES 16 to 19 and Comparative Example 2

Duracon M90-44 (polyacetal, product of Polyplastics Co., Ltd.) was placed into a twin-screw extruder of 45 mm in diameter set to 200° C. together with the potassium aluminum titanate whiskers prepared in Example 2 and surface-treated with 1% of epoxysilane ("A-187", product of Nihon Unika Co., Ltd.) in the amount shown below in Table 2. Molten K5230 and the whiskers were extruded in the extruder to form granules. The granules were injection molded under the following conditions to produce test pieces for evaluating the properties.

Cylinder temperature: 200° C.
Injection pressure: 1,000 kg/cm$^2$
Injection time: 20 sec
Mold temperature: 80° C.

The mechanical strength of the obtained test pieces was evaluated with the results shown in Table 2.

TABLE 2

|  | Com. Ex. 2 | Ex. 16 | Ex. 17 | Ex. 18 | Ex. 19 |
|---|---|---|---|---|---|
| Amount of potassium aluminum titanate whiskers (wt %) | 0 | 5 | 10 | 20 | 40 |
| Tensile strength (kgf/cm$^2$) | 570 | 650 | 780 | 1,000 | 1,150 |
| Flexural strength (kgf/cm$^2$) | 980 | 1,060 | 1,200 | 1,520 | 1,800 |
| Flexural modulus (kgf/cm$^2$) | 24,000 | 32,000 | 42,000 | 68,000 | 105,000 |
| IZOD notched impact value (kgf cm/cm) | 4.0 | 4.1 | 4.2 | 4.5 | 4.6 |

EXAMPLES 20 to 23 and Comparative Example 3

Leona 1300S (nylon-6,6, product of Asahi Chemical Industry Co., Ltd.) and the potassium aluminum titanate whiskers prepared in Example 3 and surface-treated with 1% of aminosilane ("A-1100", product of Nihon Unika Co., Ltd.) in the amount shown below in Table 3 were extruded by a twin-screw extruder of 45 mm in diameter set to 270° C. to form granules. The granules were injection molded under the following conditions to produce test pieces for evaluating the properties.

Cylinder temperature: 280° C.
Injection pressure: 800 kg/cm$^2$
Injection time: 10 sec
Mold temperature: 80° C.

The mechanical strength of the obtained test pieces was evaluated with the results shown in Table 3.

TABLE 3

|  | Com. Ex. 3 | Ex. 20 | Ex. 21 | Ex. 22 | Ex. 23 |
|---|---|---|---|---|---|
| Amount of potassium aluminum titanate whiskers (wt %) | 0 | 5 | 10 | 20 | 40 |
| Tensile strength (kgf/cm$^2$) | 810 | 920 | 1,020 | 1,240 | 1,500 |
| Flexural strength (kgf/cm$^2$) | 1,200 | 1,400 | 1,600 | 2,020 | 2,400 |
| Flexural modulus (kgf/cm$^2$) | 28,000 | 36,000 | 47,000 | 68,000 | 100,000 |
| IZOD notched impact value (kgf cm/cm) | 4.5 | 4.6 | 4.8 | 4.5 | 4.0 |

Comparative Examples 4 to 7

Test pieces for evaluating the properties were prepared under the same conditions as in Examples 21 to 24 with the exception of using, as reinforcing fibers, potassium titanate whiskers ("TISMO-N", product of Otsuka Kagaku Kabushiki Kaisha having an average fiber length of 15 μm and an average fiber diameter of 0.3 μm) surface-treated with 1% by weight of aminosilane ("A-1100", product of Nihon Unika Co., Ltd.).

The mechanical strength of the obtained test pieces was evaluated with the results shown in Table 4.

TABLE 4

|  | Com. Ex. 4 | Com. Ex. 5 | Com. Ex. 6 | Com. Ex. 7 |
|---|---|---|---|---|
| Amount of potassium titanate fibers (wt %) | 5 | 10 | 20 | 40 |
| Tensile strength (kgf/cm$^2$) | 820 | 920 | 1,040 | 1,280 |
| Flexural strength (kgf/cm$^2$) | 1,290 | 1,470 | 1,740 | 2,070 |
| Flexural modulus (kgf/cm$^2$) | 32,000 | 40,000 | 59,000 | 87,000 |
| IZOD notched impact value (kgf cm/cm) | 4.5 | 4.7 | 4.4 | 4.1 |

Comparative Examples 8 to 11

Test pieces for evaluating the properties were prepared under the same conditions as in Examples 21 to 24 with the exception of using, as reinforcing fibers, aluminum borate fibers ("Alborex Y", product of Shikoku Chemicals Corp. having an average fiber length of 20 μm and an average fiber diameter of 0.5 μm) surface-treated with 1% by weight of aminosilane ("A-1100", product of Nihon Unika Co., Ltd.).

The mechanical strength of the obtained test pieces was evaluated with the results shown in Table 5.

TABLE 5

|  | Com. Ex. 8 | Com. Ex. 9 | Com. Ex. 10 | Com. Ex. 11 |
|---|---|---|---|---|
| Amount of potassium borate fibers (wt %) | 5 | 10 | 20 | 40 |
| Tensile strength (kgf/cm$^2$) | 830 | 920 | 1,050 | 1,270 |
| Flexural strength (kgf/cm$^2$) | 1,270 | 1,440 | 1,710 | 2,050 |
| Flexural modulus (kgf/cm$^2$) | 33,000 | 42,000 | 63,000 | 91,000 |
| IZOD notched impact value (kgf cm/cm) | 4.6 | 4.8 | 4.4 | 4.0 |

EXAMPLES 24 and 25 and Comparative Examples 12 and 13

Upiron S-2000 (polycarbonate (viscosity average molecular weight (Mv) 24,000), product of Mitsubishi Polyplastics Co., Ltd.), and the fibers or whiskers shown in Table 6 and surface-treated with 1% by weight of epoxysilane ("A-187", product of Nihon Unika Co., Ltd.) in the amount shown below in Table 6 were extrusion-molded by a twin-screw extruder of 45 mm in diameter set to 280° C. to extrude the mixture into granules. The granules were injection molded under the following conditions to produce test pieces for evaluating the properties.

Cylinder temperature: 300° C.
Mold temperature: 80° C.

The mechanical strength of the obtained test pieces was evaluated with the results shown in Table 6.

Mv was given by calculating a specific viscosity ($\eta$sp) at 20° C. by the following equation using a solution of polycarbonate in methylene chloride in a concentration of 1.0 g/dl:

$$\eta sp/C = [\eta] + 0.45\,[\eta]^2 \times C$$

$$[\eta] = 1.23 \times 10^{-4} \times M^{0.83}, C=1.0$$

TABLE 6

|  | Example 24 | Example 25 | Com. Ex. 12 | Com. Ex. 13 |
|---|---|---|---|---|
| (Make-up) (part by weight) | | | | |
| Polycarbonate, | 70 | 70 | 70 | 70 |
| potassium aluminum titanate whiskers of Example 1 | 30 | | | |
| Potassium aluminum titanate whiskers of Example 2 | | 30 | | |
| Potassium titanate fibers of Comparative Example 4 | | | 30 | |
| Aluminum borate fibers of Comparative Example 8 | | | | 30 |
| (Molecular weight of polycarbonate) | | | | |
| Kneaded pellets | 22,600 | 22,800 | 20,200 | 20,600 |
| Injection moldings | 22,000 | 22,400 | 16,200 | 18,200 |
| Moldings after retention | 21,200 | 22,000 | 15,600 | 16,400 |
| (Initial properties) | | | | |
| Tensile strength (kgf/cm$^2$) | 1,220 | 1,320 | 1,020 | 1,100 |
| Elongation at fracture (%) | 4.4 | 4.6 | 4.0 | 2.5 |
| IZOD impact value (kgf cm/cm) | 4.8 | 5.2 | 3.8 | 3.5 |
| (Retentive properties) | | | | |
| Tensile strength (kgf/cm$^2$) | 1,200 | 1,280 | 980 | 1,000 |
| Elongation at fracture (%) | 4.4 | 4.5 | 3.6 | 2.2 |
| IZOD impact value (kgf cm/cm) | 4.6 | 5.1 | 3.5 | 3.1 |

The initial and retentive properties are as follows. The initial properties refer to the properties of moldings which have just finished the normal molding operation (30 seconds in retention time within the cylinder), whereas the retentive properties refer to the properties of moldings formed in the second shot (30 minutes in retention time within the cylinder).

EXAMPLES 26 and 27 and Comparative Example 14

Duranex 2002 (PBT resin, product of Polyplastics Co., Ltd.) and the potassium aluminum titanate whiskers prepared in Example 1 and surface-treated with 1% by weight of epoxysilane ("A-187", product of Nihon Unika Co., Ltd.) in the amount shown below in Table 7 were extruded by a twin-screw extruder of 45 mm in diameter set to 240° C., producing granules. The granules were injection molded under the following conditions to produce test pieces for evaluating the properties.

Cylinder pressure: 245° C.
Injection pressure: 800 kg/cm$^2$
Injection time: 20 seconds
Mold temperature: 80° C.

The mechanical strength of the obtained test pieces was evaluated with the results shown in Table 7.

TABLE 7

|  | Com. Ex. 14 | Ex. 26 | Ex. 27 | Ex. 28 | Ex. 29 |
|---|---|---|---|---|---|
| Amount of potassium aluminum titanate whiskers (wt %) | 0 | 5 | 10 | 20 | 40 |
| Tensile strength (kgf/cm$^2$) | 550 | 680 | 750 | 900 | 1,120 |
| Flexural strength (kgf/cm$^2$) | 850 | 1,290 | 1,380 | 1,600 | 1,880 |
| Flexural modulus (kgf/cm$^2$) | 23,000 | 36,000 | 46,000 | 62,000 | 110,000 |
| IZOD notched impact value (kgf cm/cm) | 3.0 | 3.2 | 3.3 | 3.6 | 4.0 |

EXAMPLES 30 to 32 and Comparative Example 15

An aromatic amine (trade name "Epicure Z", product of Yuka Shell Epoxy Co., Ltd.) as a curing agent was added to bisphenol A glycidyl ether type liquid resin (trade name "Epicoat 828", product of Yuka Shell Epoxy Co., Ltd.) in an amount of 20 parts by weight of the former per 100 parts by weight of the latter. The mixture was uniformly blended in a container fitted with a mixer to give a composition. The potassium aluminum titanate whiskers prepared in Example 1 and surface-treated with 1% by weight of aminosilane ("A-1100", product of Nihon Unika Co., Ltd.) were kneaded with said composition in the amounts shown in Table 8 using a universal stirring mixer. The mixture was placed into a mold for compression molding heated to 150° C. and compression molded thereby. These products were cured at 150° C. for 3 hours, and some properties of the products were evaluated. The results are shown in Table 8.

TABLE 8

|  | Com. Ex. 15 | Example 30 | Example 31 | Example 32 |
|---|---|---|---|---|
| (Make-up) (part by weight) | | | | |
| Epoxy resin | 100 | 100 | 100 | 100 |
| Curing agent | 20 | 20 | 20 | 20 |
| Potassium aluminum titanate whiskers of Example 1 | 0 | 15 | 30 | 45 |
| Tensile strength (kgf/cm$^2$) | 650 | 750 | 800 | 800 |
| Flexural strength (kgf/cm$^2$) | 1,200 | 1,300 | 1,400 | 1,400 |

TABLE 8-continued

|  | Com. Ex. 15 | Example 30 | Example 31 | Example 32 |
|---|---|---|---|---|
| Flexural modulus (kgf/cm$^2$) | 1,300 | 1,500 | 1,750 | 2,000 |
| IZOD notched impact value (kgf cm/cm) | 2.7 | 3.2 | 3.5 | 3.6 |

EXAMPLES 33 to 36 and Comparative Example 16

A bismaleimide triazine resin (trade name "BT-4480", product of Mitsubishi Engineering Plastics Co. Ltd.) and the potassium aluminum titanate whiskers prepared in Example 1 and surface-treated with 1% by weight of epoxysilane (trade name "A-187," product of Nihon Unika Co., Ltd.) in the amounts shown in Table 9 were stirred using a universal stirring mixer for 60 minutes. The mixture was charged into a mold and fused within an uncovered compression molding machine at a temperature of 170° C. When the mixture started to melt, a lid was placed onto the molding machine, pressure was applied and the mold was degassed for about 10 minutes. The mixture was heated to 170° C. and pressure was applied at a rate of 50 kg/cm$^2$ for 90 minutes to form a flat plate. The plate was it gradually cooled to produce test pieces. Then some properties of the test piece were determined. The results are shown in Table 9.

TABLE 9

|  | Com. Ex. 16 | Ex. 33 | Ex. 34 | Ex. 35 | Ex. 36 |
|---|---|---|---|---|---|
| (Make-up) part by weight |  |  |  |  |  |
| BT-4480 | 100 | 90 | 80 | 70 | 60 |
| Potassium aluminum titanate whiskers of Example 1 | 0 | 10 | 20 | 30 | 40 |
| Tensile strength (25° C., kgf/cm$^2$) | 243 | 330 | 432 | 520 | 480 |
| Tensile strength (150° C., kgf/cm$^2$) | 252 | 300 | 362 | 432 | 400 |
| Tensile strength (200° C., kgf/cm$^2$) | 186 | 222 | 347 | 416 | 318 |
| Flexural strength (kgf/cm$^2$) | 448 | 460 | 656 | 782 | 680 |
| Compressive strength (kgf/cm$^2$) | 2,260 | 2,280 | 2,580 | 2,900 | 2,260 |
| IZOD notched impact value (kgf cm/cm) | 4.6 | 4.4 | 5.4 | 7.4 | 4.6 |
| Deflection temperature under load (° C., 18.5 kgf/cm$^2$) | 167 | 180 | 182 | 200 | 187 |

EXAMPLE 37

Ethyl alcohol (100 cc) was poured into a 200 cc beaker. Then, 3.65 g of the potassium aluminum titanate whiskers of the formula $K_{2.0}Al_{2.0}Ti_{6.0}O_{16}$ prepared in Examples 1 and 2 and 10.79 g of pure aluminum having a particle size of up to 20 µm (whisker volume content of 20%) were charged into the beaker, irradiated with ultrasonic for 5 minutes and quickly subjected to suction filtration. Thereafter the solid was dried and ground to give a specimen powder for compression molding.

Subsequently the specimen was placed into a mold 30 mm in diameter. The specimen was pressed under a load of 5 tons in all while the mold was evacuated, giving a molded product about 3 mm in thickness. The molded product was accommodated in a case of board of alumina, maintained at 630° C. for 20 minutes and cooled to room temperature, taking about 1 hour. The sintered composite thus obtained was cut and machined by a lathe and an emery cutter to produce test pieces for flexural test.

The flexural strength of the flexural test piece obtained above was measured according to JIS Z 2204. The flexural strength was 24 kg/mm$^2$ when the whiskers of Example 1 was used and 23 kg/mm$^2$ when the whiskers of Example 2 was used.

Comparative Example 17

A flexural test piece was prepared in the same manner as in Example 37 with the exception of not adding potassium aluminum titanate whiskers and was subjected to flexural test. The flexural strength was 13 kgf/mm$^2$.

The results achieved in Example 37 and in Comparative Example 17 show that the potassium aluminum titanate whiskers were able to satisfactorily reinforce aluminum metal.

EXAMPLE 38

Into a 2000 cc ball mill were placed 1,000 cc of ethyl alcohol and alumina balls about 5 mm in diameter. Thereto added were 78.8 g of potassium aluminum titanate whiskers of the formula $K_{1.0}Al_{1.0}Ti_{7.0}O_{16}$ used in Example 3 and 107.9 g of pure aluminum (whisker volume content of 35%). After 12 hours' stirring, the mixture was quickly subjected to suction filtration. Thereafter the solid was dried and ground to give a specimen powder. A 18 g portion of the specimen was charged into a cavity of a carbon type mold, 30 mm in diameter, for hot press wherein the cavity was coated with boron nitride as a mold release agent. The specimen was maintained at a sintering temperature of 650° C. under a pressure of 1,000 kgf/cm$^2$ for 1 hour while the mold was evacuated. Thereafter the molded product was cooled to room temperature, taking about 1 hour. The sintered composite thus obtained was made into a test piece for flexural test in the same manner as in Example 37. The flexural strength was measured and was 31 kg/mm$^2$.

Comparative Example 18

A flexural test piece prepared in the same manner as in Example 38 with the exception of not adding the potassium aluminum titanate whiskers was subjected to a flexural test. The flexural strength was 16 kgf/mm$^2$.

The results obtained in Example 38 and in Comparative Example 18 showed that the potassium aluminum titanate whiskers were able to satisfactorily reinforce aluminum metal.

EXAMPLE 39

Into a 300 cc beaker was placed 50 g of the potassium aluminum titanate whiskers prepared in Examples 1 and 2. Added were 150 ml of an aqueous solution containing 0.2% of polyvinyl alcohol and 0.1% of a surfactant (trade name "Triton X-100", product of Rohm & Haas Co.). The mixture was irradiated with ultrasonic for about 5 minutes to disperse the materials. Added was 23 ml of a solution of colloid silica diluted to 10% concentration (trade name "SNOWTEX", product of Nissan Chemical Industries, Ltd.). The mixture was irradiated with ultrasonic again after which a major portion of water was removed by a rotary evaporator. The residue was placed into a cylindrical mold 53 mm in inside diameter, dewatered under a pressure of about 50 kgf/cm², released from the mold, heat-treated at about 130° C. for 4 hours and at about 600° C. for 3 hours, giving two types of preforms. The two preforms had a whisker volume content of 20%.

The two preforms obtained above were heated to 700° C. in an electric furnace and placed into a mold preheated to 500° C. An aluminum alloy ADC12 for use in casting which was melted at 700° C. was poured over the preform to immediately accomplish casting under pressure. The pressure in impregnation was about 20 kg/cm² and the ultimate pressure was 1,000 kgf/cm². After casting, the product was further cast under pressure for about 3 minutes until cooling and solidification, and released from the mold, producing a potassium aluminum titanate whisker-reinforced aluminum alloy. In this way, two types of alloys were obtained. The whisker content as calculated from the weight of the preform used and the shape of the composite after casting was 20% by volume. Thus it was confirmed that the desired composite was produced.

A small size dumbbell was cut out in a direction of diameter from the pillar-shape composite and was subjected to a tensile test according to JIS Z 2241. The two dumbbells were obtained in this way. The tensile strength of the two dumbbells was 38 kgf/mm².

The composite thus obtained was found to be easily cut by common metal-cutting tools and to have good characteristics from the viewpoint of machining costs.

Comparative Example 19

An ADC12 alloy was cast under pressure under the same conditions as in Example 40 with the exception of not using the preform. The alloy specimen thus obtained was subjected to the same tensile test as in Example 40. The tensile strength was 24 kgf/mm².

Comparative Example 20

A preform was obtained in the same manner as in Example 39 with the exception of using 46 g of potassium titanate whiskers (formula $K_2O \cdot 6TiO_2$ having an average fiber diameter of 0.3 μm and an average fiber length of 15 μm) in place of the potassium aluminum titanate whiskers. The preform had a whisker volume content of 20%. The preform and aluminum alloy were made into a composite in the same manner as in Example 39, giving a potassium titanate whisker-reinforced aluminum alloy. In the procedure, the pressure in impregnation was about 60 kg/cm² and the ultimate pressure was 1,000 kgf/cm², i.e. three times the pressure involved in impregnation of potassium aluminum titanate whiskers. The composite had a slight indent in the center compared with the preform before being made into a composite. The whisker content as calculated from the weight of the preform used and the shape of the composite after casting was 28% by volume. Thus it was confirmed that the composite was deformed by compression compared with the shape of the desired composite. The specimen thus obtained was subjected to the same tensile test as in Example 39. The tensile strength was 27 kgf/mm². The composite achieved incomplete reinforcement as compared with the potassium aluminum titanate whiskers-reinforced specimen.

We claim:
1. A process for preparing titanate whiskers represented by the formula

$$A^I_v A^{II}_w M^{II}_x M^{III}_y Ti_{8-z} O_{16}$$

wherein $A^I$ is at least one member selected from alkali metals, $A^{II}$ is Ba, $M^{II}$ is at least one member selected from group consisting of Mg, Co, Ni, Zn, Cu and Mn, $M^{III}$ is at least one member selected from the group consisting of Al, Sc, Cr, Fe and Ga, and v, w, x, y and z are numbers which fulfill $0.5 \leq 2x+y \leq 2.5$, $2x+y=v+2w$, and $z=x+y$, provided that the whiskers wherein w and x are both zero, $A^I$ is K and $M^{III}$ is Al are excluded, the process comprising the steps of heating at a temperature of 900 to 1,300° C. (a) at least one member selected from the group consisting of particulate or fibrous titanium source components represented by the formula $$TiO_2 \cdot nH_2O$$

wherein n is a real number of 0 to 8, (b) source components of metals $M^{II}$ and $M^{III}$ selected from the group consisting of hydroxides of metal $M^{II}$, hydroxides of metal $M^{III}$, hydrous oxides of metal $M^{II}$, hydrous oxides of metal $M^{III}$, inorganic acid salts of metal $M^{II}$, inorganic acid salts of metal $M^{III}$, composite oxide salts of alkali metals and metal $M^{II}$ and composite oxide salts of alkali metals and metal $M^{III}$, and optionally (c) source components of metals $A^I$ and $A^{II}$ selected from the group consisting of hydroxides of Ba, inorganic acid salts of Ba, sulfates of alkali metals, chlorides of alkali metals and bromides of alkali metals in the presence of a fusing agent essentially containing at least one member selected from the group consisting of sulfates of potassium and sulfates of sodium to undergo a reaction for the growth of crystals, and cooling them.

* * * * *